United States Patent
Lee et al.

(10) Patent No.: US 10,184,991 B2
(45) Date of Patent: Jan. 22, 2019

(54) DUAL-AXIS FLUXGATE DEVICE

(71) Applicant: Texas Instruments Incorporated, Dallas, TX (US)

(72) Inventors: Dok Won Lee, Mountain View, CA (US); William David French, San Jose, CA (US); Ricky Alan Jackson, Richardson, TX (US); Ann Margaret Gabrys, Woodside, CA (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 15/152,002

(22) Filed: May 11, 2016

(65) Prior Publication Data

US 2017/0328961 A1 Nov. 16, 2017

(51) Int. Cl.
| | |
|---|---|
| *G01R 33/04* | (2006.01) |
| *G01R 33/02* | (2006.01) |
| *H01L 27/22* | (2006.01) |
| *H01L 43/12* | (2006.01) |

(52) U.S. Cl.
CPC .............. *G01R 33/04* (2013.01); *H01L 27/22* (2013.01); *H01L 43/12* (2013.01)

(58) Field of Classification Search
CPC .... G01R 33/02; G01R 33/04; G01R 33/0047; G01R 33/05; G01R 33/045; G01R 33/18; G01R 15/148
See application file for complete search history.

(56) References Cited

U.S. PATENT DOCUMENTS

| | | | |
|---|---|---|---|
| 6,278,272 B1 * | 8/2001 | Scarzello | G01R 33/045 |
| | | | 324/253 |
| 7,414,399 B2 | 8/2008 | Delevoye et al. | |
| 7,737,687 B2 | 6/2010 | Na et al. | |
| 2013/0320969 A1 * | 12/2013 | Reichenbach | G01R 33/0052 |
| | | | 324/247 |
| 2014/0285189 A1 * | 9/2014 | Kashmiri | G01R 33/04 |
| | | | 324/253 |
| 2015/0048820 A1 | 2/2015 | Schaffer et al. | |
| 2015/0160307 A1 * | 6/2015 | Kim | G01R 33/04 |
| | | | 324/253 |
| 2015/0338474 A1 | 11/2015 | Mohan et al. | |

FOREIGN PATENT DOCUMENTS

EP 1387179 A2 2/2003

OTHER PUBLICATIONS

Fraux, Romain, "Technological and Cost Evolution of Consumer Inertial Combo Sensors," System Plus Consulting, presentation at Semicon Europa2014, Oct. 6-9, 2014 (35 pages).

(Continued)

*Primary Examiner* — Minh N Tang
(74) *Attorney, Agent, or Firm* — Tuenlap D. Chan; Charles A. Brill; Frank D. Cimino (57) ABSTRACT

A fluxgate device that includes a first magnetic core and a second magnetic core. The first magnetic core has a first magnetized direction that deviates from a first sense direction by more than 0 degree and less than 90 degrees. The second magnetic core is arranged orthogonally to the first magnetic core. The second magnetic core has a second magnetized direction that deviates from a second sense direction by more than 0 degree and less than 90 degrees.

18 Claims, 6 Drawing Sheets

(56) References Cited

OTHER PUBLICATIONS

Snoeij, Martin F., et al., "An Integrated Fluxgate Magnetometer for use in Closed-Loop/Open-Loop Isolated Current Sensing," Texas Instruments, Freising, Germany, copyright IEEE 2015 (4 pages).
Notification of Transmittal of the International Search Report and the Written Opinion of the International Searching Authority,or the Declaration.

* cited by examiner

DUAL-AXIS FLUXGATE DEVICE

BACKGROUND

A fluxgate device generally includes a magnetic core structure and coil members coiling around the magnetic core. A fluxgate device can be used as a magnetometer for detecting a change in magnetic flux in an environment adjacent to the magnetic core structure. Attempts have been made to interface a fluxgate device with an integrated circuit for adapting to various industrial applications. For instance, a fluxgate device interfaced with a control circuit can be adapted as current measurement devices for use in motor control systems, or as position sensing device for use in robotic systems. Moreover, a fluxgate device may be adapted to perform dual-axis sensing applications, such as e-compass applications. However, these solutions typically involve tradeoffs between high sensitivity and low noise performances.

SUMMARY

The present disclosure describes systems and techniques relating to the fabrication of fluxgate devices, which includes integrated fluxgate devices that are integrated with one or more circuits formed on a semiconductor substrate. More specifically, the present disclosure describes a fluxgate device that delivers high sensitivity performance with a relatively low susceptibility to fluxgate noise in two-dimensional sensing applications, such as e-compass applications. The disclosed fluxgate device includes at least two magnetic cores that are respectively aligned in two substantially perpendicular sensing direction. The magnetic cores are magnetized according to a magnetization direction that reduces the dependency on shape anisotropy of the magnetic cores while maintaining a low susceptibly to fluxgate noises. Advantageously, the magnetic cores can afford a wider range of geometric configurations, which may help reduce the overall size of the fluxgate device.

In one implementation, for example, the present disclosure describes an integrated circuit that includes a semiconductor substrate, a fluxgate device formed above the semiconductor substrate, and a sense circuit having transistors formed partially in the semiconductor substrate and under the fluxgate device. The fluxgate device includes a first magnetic core, a second magnetic core, a first sense coil, and a second sense coil. The first magnetic core has a first magnetized direction that deviates from a first sense direction by more than 0 degree and less than 90 degrees. The first sense coil includes first coil members that coil around the first magnetic core, and the first sense coil defines the first sense direction perpendicular to the first coil members. The second magnetic core is arranged orthogonally to the first magnetic core. Like the first magnetic core, the second magnetic core has a second magnetized direction that deviates from a second sense direction by more than 0 degree and less than 90 degrees. The second sense coil including second coil members that coil around the second magnetic core, and the second sense coil defines the second sense direction perpendicular to the second coil members. To process the signals received by the first and second sense coils, the sense circuit is coupled to the first sense coil and the second sense coil to receive these signals.

In another implementation, for example, the present disclosure describe a fluxgate device that includes a first magnetic core and a second magnetic core. The first magnetic core has a first magnetized direction that deviates from a first sense direction by more than 0 degree and less than 90 degrees. The second magnetic core is arranged orthogonally to the first magnetic core. The second magnetic core has a second magnetized direction that deviates from a second sense direction by more than 0 degree and less than 90 degrees.

In yet another implementation, for example, the present disclosure describes a method that includes forming a first magnetic core along a first sense direction of a fluxgate device. The method also includes forming a second magnetic core along a second sense direction of the fluxgate device orthogonal to the first sense direction. The method further includes magnetizing the first and second magnetic cores according to a magnetization direction deviating from the first and second sense directions.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
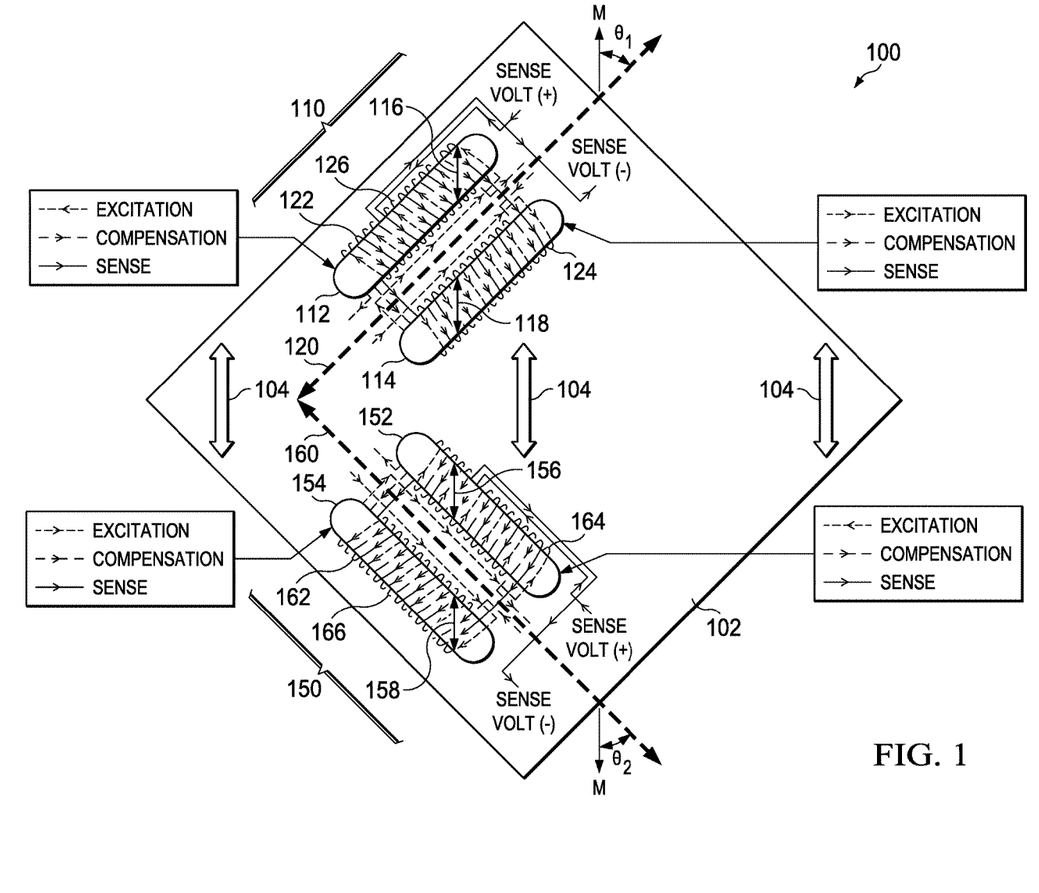
FIG. 1 shows a top view of an integrated fluxgate device according to an aspect of the present disclosure.

FIG. 1 shows a top view of an integrated fluxgate device (IFD) 100 according to an aspect of the present disclosure. The IFD 100 can be formed on or above a semiconductor substrate 102, which is used for establishing circuitry that controls the operations of the IFD 100. The IFD 100 includes a first fluxgate 110 and a second fluxgate 150. For two-dimensional (2D) magnetic field sensing, the first fluxgate 110 is arranged orthogonally to the second fluxgate 150.

The first fluxgate 110 includes one or more first magnetic cores, such as first magnetic cores 112 and 114. The first fluxgate 110 also includes a first sense coil 122, a first excitation coil 124, and optionally, a first compensation coil 126. The first sense coil 122, the first excitation coil 124, and the first compensation coil 126 each includes coil members that coil around the first magnetic cores 112 and 114. For differential sensing, the first sense coil 122 and the first excitation coil 124 have the same coiling direction around the first magnetic core 112, whereas the first sense coil 122 and the first excitation coil 124 have the opposite coiling directions around the first magnetic core 114. When included, the first compensation coil 126 has the same coiling direction as the first sense coil 122 around both the first magnetic cores 112 and 114.

Likewise, the second fluxgate 150 includes one or more second magnetic cores, such as second magnetic cores 152 and 154. The second fluxgate 150 also includes a second sense coil 162, a second excitation coil 164, and optionally, a second compensation coil 166. The second sense coil 162, the second excitation coil 164, and the second compensation coil 166 each includes coil members that coil around the second magnetic cores 152 and 154. For differential sensing, the second sense coil 162 and the second excitation coil 164 have the same coiling direction around the second magnetic core 152, whereas the second sense coil 162 and the second excitation coil 164 have the opposite coiling directions around the second magnetic core 154. When included, the second compensation coil 166 has the same coiling direction as the second sense coil 162 around both the second magnetic cores 152 and 154.

The coil members of the first sense coil 122 define a first sense direction 120 that is substantially perpendicular (e.g., within a plus-and-minus 5% range of tolerance) to the coiling direction of these coil members. Because the first sense coil 122 coils around the first magnetic cores 112 and 114, the first sense direction 120 is substantially parallel to the longitudinal edges of the first magnetic cores 112 and 114. Likewise, the coil members of the second sense coil 162 define a second sense direction 160 that is substantially perpendicular (e.g., within a plus-and-minus 5% range of tolerance) to the coiling direction of these coil members. Because the second sense coil 162 coils around the second magnetic cores 152 and 154, the second sense direction 160 is substantially parallel to the longitudinal edges of the second magnetic cores 152 and 154. Since the first fluxgate 110 is arranged orthogonally to the second fluxgate 150, the first sense direction 120 is substantially orthogonal (e.g., within a plus-and-minus 5° of angular deviation) to the second sense direction 160.

To minimize the reception of fluxgate noise, a magnetic core may be magnetized according to a magnetization direction that is perpendicular to the sense direction of the fluxgate. In the application of 2D magnetic field sensing, the magnetization of the first magnetic cores 112 and 114 and the second magnetic cores 152 and 154 is generally performed under the same process steps in order to reduce the complexity and costs associated with the fabrication of the IFD 100. Under these conditions, the magnetization direction is substantially the same for the first magnetic cores 112 and 114 and the second magnetic cores 152 and 154. This means one set of magnetic cores is magnetized parallel to the respective sensing direction, whereas the other set of magnetic core is magnetized perpendicular to the respective sensing direction. In general, the fluxgate with magnetic core magnetized perpendicular to the respective sensing direction (i.e., hard axis magnetization) is less susceptible to fluxgate noise than the fluxgate with magnetic core magnetized parallel to the respective sensing direction (i.e., easy axis magnetization). When the magnetization direction is perpendicular to one of the sense directions (e.g., 120 or 160), one of the orthogonally arranged fluxgates (e.g., 110 and 150) will likely experience higher fluxgate noise than the other one. This imbalance will lead to mismatch in sensitivity and noise susceptibility between the two orthogonally arranged fluxgates (e.g., 110 and 150).

An aspect of the present disclosure provides a solution to reduce the noise and sensitivity mismatch between the fluxgates for use in 2D magnetic field sensing. The disclosed solution involves magnetizing orthogonally arranged magnetic cores (e.g., 112, 114, 152, and 154) according to a magnetization direction (e.g., 104) that deviates from both of the orthogonally defined sense directions (e.g., 120 and 160) of the orthogonally arranged magnetic cores.

In one configuration, the magnetization direction (e.g., 104) is configured to deviate from each of the first sense direction 120 and the second sense direction 160 by more than 0 degree but less than 90 degrees. As such, the magnetization direction (e.g., 104) is neither parallel, nor orthogonal, to either one of the first sense direction 120 and the second sense direction 160. Upon the magnetization process is completed, the first magnetic cores 112 and 114 have first magnetized directions 116 and 118 respectively. Each of the magnetized directions 116 and 118 deviates from the first sense direction 120 by more than 0 degree but less than 90 degrees (i.e., 0°<first deviation angle $\theta_1$<90°). Likewise, the second magnetic cores 152 and 154 have second magnetized directions 156 and 158 respectively, both of which are substantially parallel to the first magnetized directions 116 and 118. Each of the magnetized directions 156 and 158 deviates from the second sense direction 160 by more than 0 degree but less than 90 degrees (i.e., 0°<second deviation angle $\theta_2$<90°). Advantageously, this particular configuration helps reduce the imbalances in sensitivity and noise susceptibility between the first fluxgate 110 and the second fluxgate 150.

In one implementation, the magnetization direction 104 is configured to deviate from each of the first sense direction 120 and the second sense direction 160 by approximately 45 degrees. As such, the magnetization direction 104 is aligned at approximately 45 degrees counterclockwise relative to the first sense direction 120 and 45 degrees clockwise relative to the second sense direction 160. Depending on variations in certain process parameters (e.g., deviations in size and/or shape among the first and second magnetic cores 112, 114, 152, and 154), the approximation in degrees may range from plus 10 degrees to minus 10 degrees. Advantageously, this particular configuration helps further reduce the imbalances in sensibility and noise susceptibility between the first fluxgate 110 and the second fluxgate 150. The approximation in degrees may also range from plus 7.5 degrees to minus 7.5 degrees for more optimized performance in 2D magnetic field sensing.

Upon the magnetization process is completed, the first magnetic cores 112 and 114 have first magnetized directions 116 and 118 respectively. Each of the magnetized directions 116 and 118 deviates from the first sense direction 120 by approximately 45 degrees counterclockwise (i.e., −(45°+Δ) ≤first deviation angle $\theta_1$≤−(45°−Δ), where Δ represents the range of approximation). Likewise, the second magnetic cores 152 and 154 have second magnetized directions 156 and 158 respectively, both of which are substantially parallel to the first magnetized directions 116 and 118. Each of the magnetized directions 156 and 158 deviates from the second sense direction 160 by approximately 45 degrees clockwise (i.e., (45°−Δ)≤second deviation angle $\theta_2$≤(45°+Δ), where Δ represents the range of approximation). To that end, each of the first fluxgate 110 and the second fluxgate 150 may have a noise susceptibility (e.g., 2-3 μT) that is substantially lower than the magnetic field of the Earth (e.g., 20-50 μT).

Figure 2:
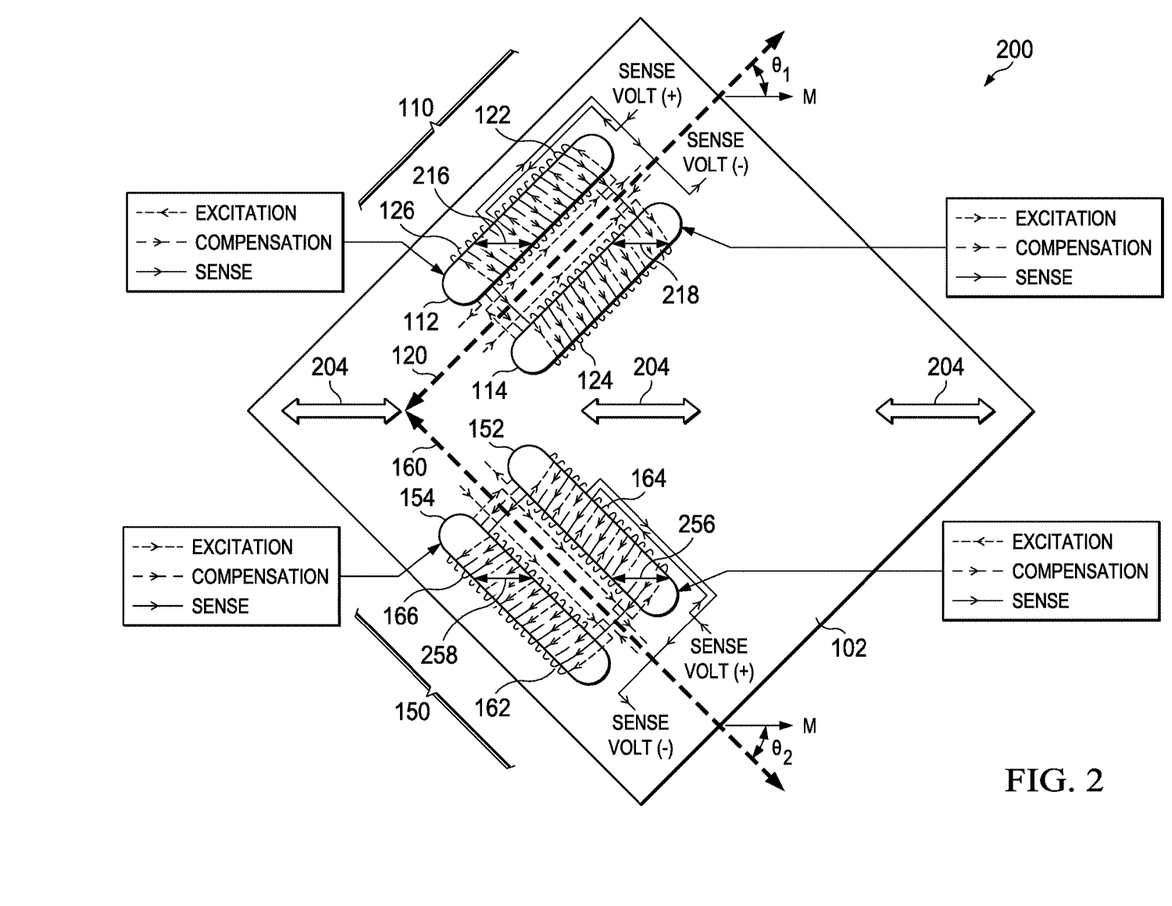
FIG. 2 shows a top view of an integrated fluxgate device according to another aspect of the present disclosure.

Although FIG. 1 shows that the magnetization direction 104 is aligned at approximately 45 degrees counterclockwise relative to the first sense direction 120 and 45 degrees clockwise relative to the second sense direction 160, other magnetization directions are possible. For instance, FIG. 2 shows a top view of an integrated fluxgate device 200 having a different magnetization direction 204. In this particular configuration, the magnetization direction 204 is aligned at approximately 45 degrees clockwise relative to the first sense direction 120 and 45 degrees counterclockwise relative to the second sense direction 160. Depending on variations in certain process parameters (e.g., deviations in size and/or shape among the first and second magnetic cores 112, 114, 152, and 154), the approximation in degrees may range from plus 10 degrees to minus 10 degrees. Advantageously, this particular configuration helps further reduce the imbalances in sensibility and noise susceptibility between the first fluxgate 110 and the second fluxgate 150. The approximation in degrees may also range from plus 7.5 degrees to minus 7.5 degrees for more optimized performance in 2D magnetic field sensing.

Upon the magnetization process is completed, the first magnetic cores 112 and 114 have first magnetized directions 216 and 218 respectively. Each of the magnetized directions 216 and 218 deviates from the first sense direction 120 by approximately 45 degrees clockwise (i.e., $(45°-\Delta) \leq$ first deviation angle $\theta_1 \leq (45°+\Delta)$, where $\Delta$ represents the range of approximation). Likewise, the second magnetic cores 152 and 154 have second magnetized directions 256 and 258 respectively, both of which are substantially parallel to the first magnetized directions 216 and 218. Each of the magnetized directions 256 and 258 deviates from the second sense direction 160 by approximately 45 degrees counterclockwise (i.e., $-(45°+\Delta) \leq$ second deviation angle $\theta_2 \leq -(45°-\Delta)$, where $\Delta$ represents the range of approximation). Like the IDF 100, the IDF 200 may have a noise susceptibility (e.g., 2-3 µT) that is substantially lower than the magnetic field of the Earth (e.g., 20-50 µT).

According to an aspect of the present disclosure, the magnetic core (e.g., 112, 114, 152, and 154) includes soft magnetic alloys with high magnetic permeability, such as nickel iron (NiFe). These alloys can be magnetized spontaneously, and the direction of magnetization is determined by the net or overall anisotropy. Several anisotropies exist in nature, including induced anisotropies, shape anisotropies, magneto-crystalline anisotropies, and stress-induced anisotropies. In general, soft magnetic alloys have relatively small magneto-crystalline anisotropies and stress-induced anisotropies. As such, the net or overall anisotropy of a soft magnetic alloy is determined by the relative strength between the induced anisotropy and the shape anisotropy.

The strength of an induced anisotropy is controllable by the fabrication process because the magnetization direction (e.g., 104 or 204) applied during the deposition of the magnetic cores becomes the direction of the induced anisotropy. As such, the magnetization direction may become the resulting magnetization (i.e., magnetized direction) of the magnetic cores where the induced anisotropy is the dominant anisotropy.

Figure 3:
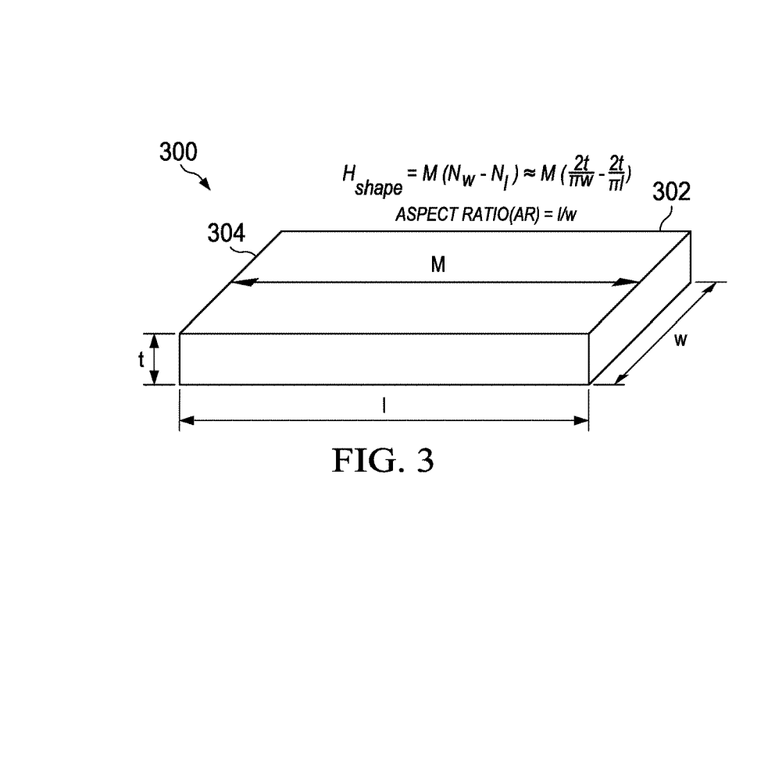
FIG. 3 shows a perspective view of a magnetic core film according to an aspect of the present disclosure.

On the other hand, the strength of a shape anisotropy is determined by the geometric dimensions of the magnetic core. In particular, a demagnetizing field is the weakest along the longitudinal direction of a magnetic core. Thus, to minimize the magneto-static energy, a shape anisotropy prefers the magnetization to be aligned along the longitudinal direction of the magnetic core. As shown in FIG. 3, for example, a magnetic film 300 for constructing a magnetic core has a shape anisotropy $H_{shape}$ that is dependent on the geometric dimensions of the magnetic film 300. These geometric dimensions include a thickness (t) of the magnetic film 300, a width (w) defined by a terminal edge 304, and a length (l) defined by a longitudinal edge 302. In general, the shape anisotropy $H_{shape}$ may be defined by Equation (1.0) below (given in SI units), where M represents the magnetization of the magnetic alloy, $N_w$ represents the demagnetizing factor along the terminal edge direction (e.g., 304), and $N_l$ represents the demagnetizing factor along the longitudinal edge direction (e.g., 302).

$$H_{shape} = M(N_w - N_l) \approx M * \frac{2t}{\pi} * \left(\frac{1}{w} - \frac{1}{l}\right) \qquad \text{Eq. (1.0)}$$

Accordingly, a fluxgate device with magnetic cores relying heavily on a shape anisotropy typically has a relatively large aspect ratio (i.e. the length divided by the width of a magnetic core). A relatively large aspect ratio (e.g., AR≥30) imposes certain size requirements on the magnetic cores. For instance, a magnetic core having a shape anisotropy of 144 Oersted (Oe) may require a length of 990 µm and a width not greater than 33 µm, thereby resulting in an aspect ratio of 30. A fluxgate integrated circuit die incorporating this particular magnetic core may have limited options on sizing and placing the magnetic core. Thus, the size requirements imposed by shape anisotropies increase the overall size of a fluxgate die and restricting the placement of circuitry around the magnetic cores.

The present disclosure provides a solution to the size restrictions imposed by shape anisotropies. More specifically, the IFD 100 and the IFD 200 are both dominated by induced anisotropies such that the magnetic cores of these devices may have a flexible range of aspect ratios. In one implementation, for example, the aspect ratio of each of the magnetic cores 112, 114, 152, and 154 may be set at a value that is less than 30. To that end, the difference between the length and the width of each magnetic core (e.g., 112, 114, 152, or 154) become less drastic that the overall size of the fluxgate device (e.g., 100 or 200) may be reduced. At the same time, the placement of other circuitry may also become less restrictive. For instance, the length of each magnetic core (e.g., 112, 114, 152, or 154) may be reduced to 700 µm while adjusting the corresponding width to 50 µm or more. In this case, the aspect ratio of each magnetic core (e.g., 112, 114, 152, or 154) may be reduced to 14.

Figure 4A:
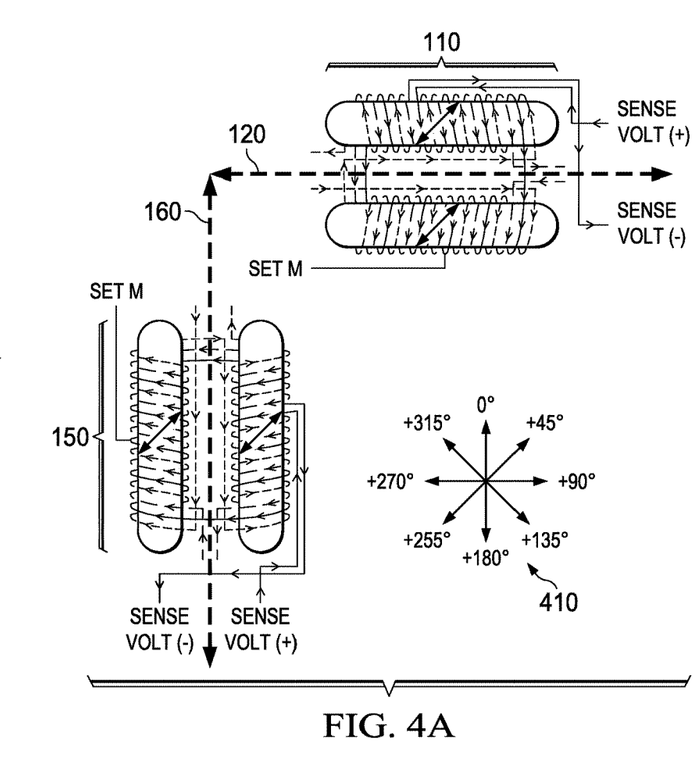
FIG. 4A shows a top view of the integrated fluxgate device detecting an external magnetic field according to an aspect of the present disclosure.
Figure 4B:
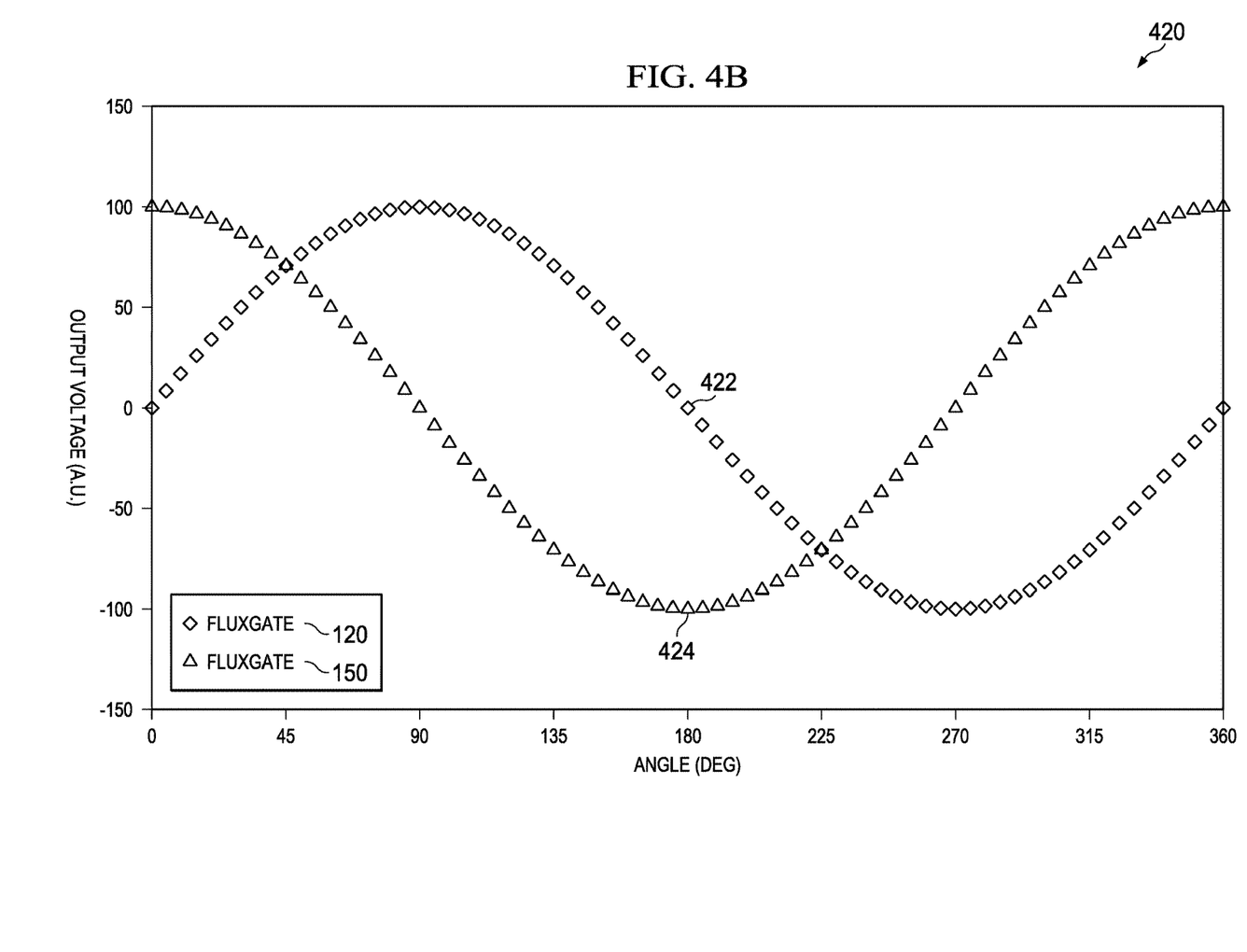
FIG. 4B shows a voltage chart of the integrated fluxgate device detecting the external magnetic field according to an aspect of the present disclosure.

FIG. 4A shows a top view of the integrated fluxgate device 100 detecting an external magnetic field 410, and FIG. 4B shows a sense output chart 420 representing the results of such a detection. The first sense output signal 422 corresponds to the magnetic field 410 detected by the first fluxgate 110, whereas the second sense output signal 424 corresponds to the magnetic field 410 detected by the second fluxgate 150. The voltages of first sense output signal 422 and the second sense output signal 424 have a phase difference of 90 degrees because of the orthogonal arrangement between the first fluxgate 110 and the second fluxgate 150. In general, the first sense output signal 422 has a voltage $V_{FG1}$ defined by Equation (2.1), and the second sense output signal 424 has a voltage $V_{FG2}$ defined by Equation (2.2).

$$V_{FG1} = V_{Max} * \sin \theta \qquad \text{Eq. (2.1)}$$

$$V_{FG2} = V_{Max} * \cos \theta \qquad \text{Eq. (2.2)}$$

As recited in Equations (2.1) and (2.2), $V_{max}$ represents the normalized output voltage corresponds to the strength of the external magnetic field 410 and $\theta$ represents the alignment of the external magnetic field 410. To determine the angular position of the external magnetic field 410, the IFD 100 includes a circuit that calculates the value of θ by applying Equation (3.0).

$$\theta = \tan^{-1}\left(\frac{V_{FG1}}{V_{FG2}}\right) \qquad \text{Eq. (3.0)}$$

To determine the strength of the external magnetic field 410, the IFD 100 includes a circuit that calculate the normalized output voltage $V_{Max}$ by applying the calculated value of θ to either Equation (4.1) or Equation (4.2).

$$V_{Max} = \frac{V_{FG1}}{\sin\theta} \qquad \text{Eq. (4.1)}$$

$$V_{Max} = \frac{V_{FG2}}{\cos\theta} \qquad \text{Eq. (4.2)}$$

Figure 5:
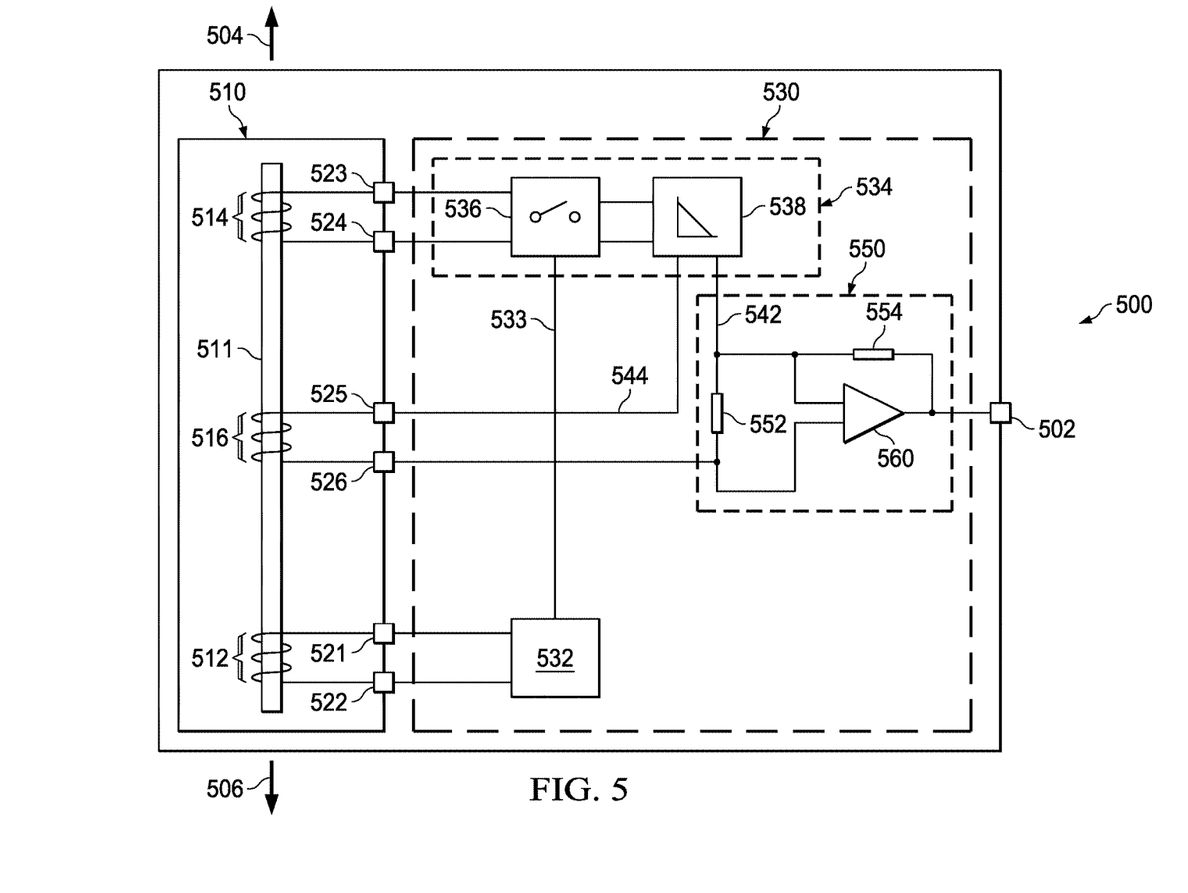
FIG. 5 shows a schematic view of an integrated fluxgate device according to an aspect of the present disclosure.

The IFD 100 and the IFD 200 includes a sense circuit having transistors formed partially in the semiconductor substrate 102. The sense circuit can be formed under the first fluxgate 110 and the second fluxgate 150. To detect and generate the fluxgate sense voltages $V_{FG1}$ and $V_{FG2}$, the sense circuit is coupled to the first sense coil 122 and the second sense coil 162. FIG. 5 shows a schematic view of an integrated fluxgate device 500 according to an aspect of the present disclosure. The integrated fluxgate device 500 can be realized by an integrated circuit die incorporating a fluxgate device 510 and a fluxgate processing circuit 530.

The fluxgate device 510 is manufactured by modeling each of the first fluxgate 110 and second fluxgate 150 as shown and described in FIGS. 1-4. Thus, the fluxgate device 510 incorporates the structural and functional features of the first fluxgate 110 and the second fluxgate 150 even though some of these features are not explicitly shown in FIG. 5. For instance, the fluxgate device 510 is for use in 2D magnetic field sensing applications, even though the structures shown therein are simplified to illustrate only unidirectional sensing.

The fluxgate device 510 includes a magnetic core 511, an excitation coil 512, a sense coil 514, and a compensation coil 516 arranged in substantially the same ways as their counterparts as shown in FIGS. 1-4. The magnetic core 511 is oriented parallel to the first sensing direction 504 and the second sensing direction 506 of the integrated fluxgate circuit 500. The excitation coil 512 is extended between a first excitation terminal 521 and a second excitation terminal 522. The excitation coil 512 coils around the longitudinal edge of the magnetic core 511. The sense coil 514 is extended between a first sense terminal 523 and a second sense terminal 524, and the sense coil 514 coils around the longitudinal edge of the magnetic core 511. To enable 2D magnetic field sensing, multiple instances of the fluxgate device 510 can be arranged and configured according to the illustrations and disclosures of FIGS. 1-4.

The fluxgate processing circuit 530 includes an excitation circuit 532, a sense circuit 534, and an output stage 550. The excitation circuit 532 is coupled to the excitation coil 512 via the first excitation terminal 521 and the second excitation terminal 522. The excitation circuit 532 is configured to generate an excitation signal including an excitation current to be conducted by the excitation coil 512. In a consecutive and alternating pattern, the excitation current may flow from the first excitation terminal 521 to the second excitation terminal 522 via the excitation coil 512 during a first time period, and from the second excitation terminal 522 to the first excitation terminal 521 via the excitation coil 512 during a second time period. By applying the alternating excitation current, the excitation circuit 532 is configured to drive the magnetic core 511 in and out of magnetic saturation during consecutive time periods. The change in magnetic saturation due to the presence of an external magnetic field is detected by the sense coil 514, and the output voltage is generated by the sense circuit 534.

The sense circuit 534 includes a fluxgate front-end (FFE) circuit 536 and an integrator circuit 538. The FFE circuit 536 is coupled to the sense coil 514 via the first sense terminal 523 and the second sense terminal 524. The FFE circuit 536 is configured to receive a sense signal from the sense coil 514 and demodulate the sense signal based on a synchronization scheme that synchronizes with the movement of the excitation current. In one implementation, for example, the FFE circuit 536 is coupled to the excitation circuit 532 to receive a synchronization signal 533. The synchronization signal 533 may indicate, during a certain period of time, whether the excitation current is flowing from the first excitation terminal 521 to the second excitation terminal 522 via the excitation coil 512, or from the second excitation terminal 522 to the first excitation terminal 521 via the excitation coil 512. Based on the synchronization signal 533, the FFE circuit 536 is configured to demodulate the sense signal using two or more switches, such as chopper switches.

The integrator circuit 538 is coupled to the FFE circuit 536 to receive the demodulated sense signal. The integrator circuit 538 is configured to integrate the demodulated sense signal to generate a sense voltage across a first integrator output 542 and a second integrator output 544. The sense voltage drives the compensation coil 516 via the first compensation terminal 525 and the second compensation terminal 526 to conduct a compensation current. The compensation current helps reset the magnetic field detected by the sense coil 514 within a closed-loop configuration. This reset process enables the sense circuit 534 to operate within a linear region so as to optimize the sensitivity of the integrated fluxgate device 500.

The output stage 550 is coupled to the first integrator output 542 and the second integrator output 544. The output stage 550 includes a matching impedance 552, a feedback impedance 554, and a differential amplifier 560. The matching impedance 552 provides matching between the differential inputs of the differential amplifier 560. The differential amplifier 560 is configured to generate a fluxgate output voltage (e.g., $V_{FG1}$ or $V_{FG2}$) to be delivered at the output port 502. The feedback impedance 554 provides a feedback path from the output of the differential amplifier 560.

Figure 6:
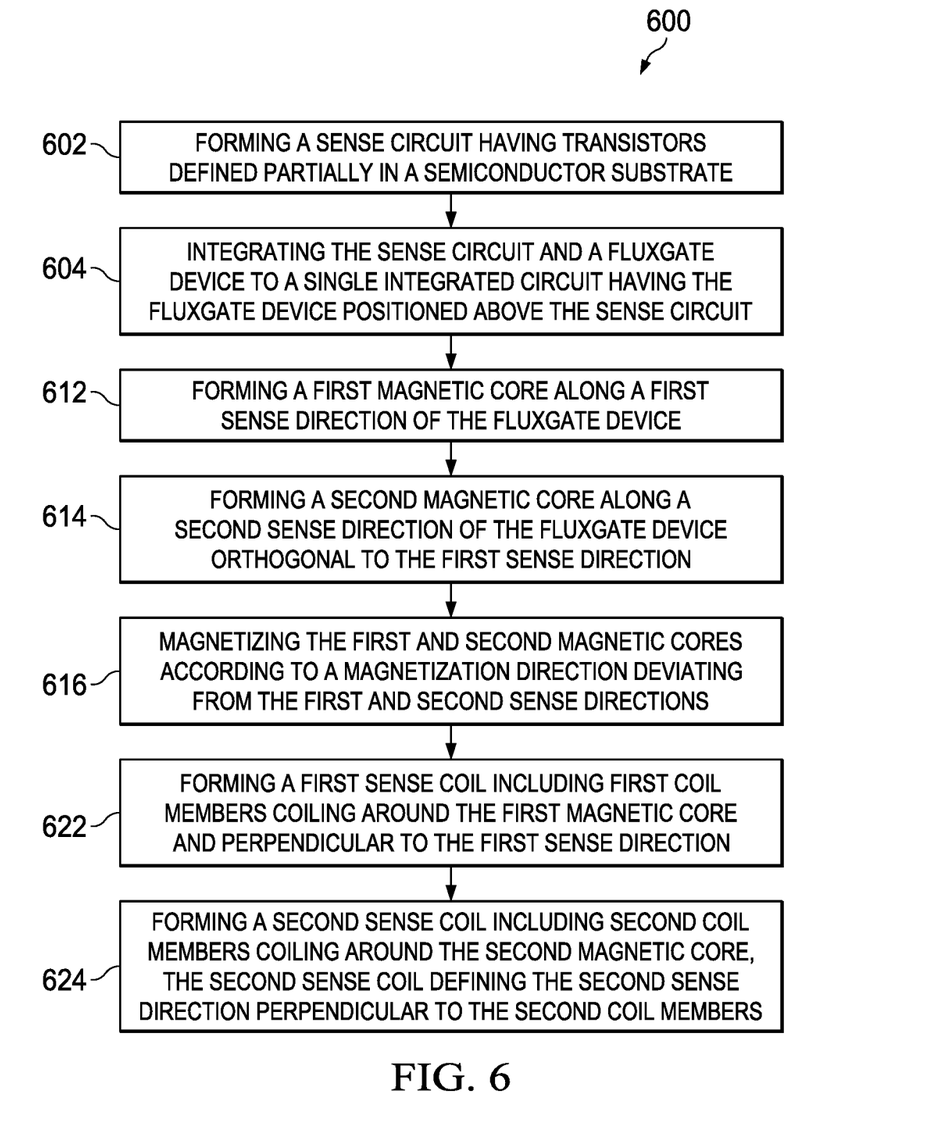
FIG. 6 shows a flow diagram of a method of fabricating an integrated circuit integrating a fluxgate device and a fluxgate processing circuit according to an aspect of the present disclosure.

FIG. 6 shows a flow diagram of a method 600 of fabricating an integrated circuit (e.g., 500) integrating a fluxgate device (e.g., 510) and a fluxgate processing circuit (e.g., 530) according to an aspect of the present disclosure. The method 600 begins at step 602, which involves forming a sense circuit (e.g., 534) having transistors defined partially in a semiconductor substrate (e.g., 102). Then, the method 600 proceeds to step 604, which involves integrating the sense circuit and a fluxgate device (e.g., 110 and 150 as shown in FIGS. 1 and 2, and/or 510 as shown in FIG. 5) to a single integrated circuit having the fluxgate device positioned above the sense circuit.

Then, the method 600 proceeds to step 612, which involves forming a first magnetic core (e.g., 112 and/or 114) along a first sense direction (e.g., 120) of the fluxgate device.

Step 612 includes the alternating depositions of a magnetic alloy, such as nickel iron, and an insulation material, such as silicon nitride. Step 612 also includes the patterning of the deposited magnetic alloy and insulation material. The patterning process defines an aspect ratio of the first magnetic core (e.g., 112 and/or 114), which has a width that can be greater than or equal to 50 μm across the first sense direction (e.g., 120). In one implementation, the aspect ratio is less than 30. In another implementation, the aspect ratio is less than or equal to 14.

The method 600 may proceeds to step 614 after step 612. Alternatively, the method 600 may perform step 612 simultaneously with step 614. Like step 612, step 614 involves forming a second magnetic core (e.g., 152 and/or 154) along a second sense direction (e.g., 160) of the fluxgate device. Step 614 includes the alternating depositions of a magnetic alloy, such as nickel iron, and an insulation material, such as silicon nitride. Step 614 also includes the patterning of the deposited magnetic alloy and insulation material. The patterning process defines an aspect ratio of the second magnetic core (e.g., 152 and/or 154), which has a width that can be greater than or equal to 50 μm across the second sense direction (e.g., 160). In one implementation, the aspect ratio is less than 30. In another implementation, the aspect ratio is less than or equal to 14. When step 614 is performed simultaneously with step 612, the first magnetic core and the second magnetic core are formed under the same deposition and patterning process flows.

Then, the method 600 proceeds to step 616, which involves magnetizing the first and second magnetic cores according to a magnetization direction (e.g., 104 or 204) that deviates from the first and second sense directions (e.g., 120 and 160). Alternatively, the method 600 may perform step 616 simultaneously with steps 612 and 614. The deviation can be based upon and thus consistent with the disclosure of FIGS. 1-4. In one implementation, for example, the magnetization direction may deviate from the first sense direction by approximately 45 degrees clockwise and from the second sense direction by approximately 45 degrees counterclockwise. In another implementation, for example, the magnetization direction may deviate from the first sense direction by approximately 45 degrees clockwise and from the second sense direction by approximately 45 degrees counterclockwise. Consistent with the disclosure associated with FIG. 3, the magnetizing step includes induced anisotropy magnetizing the first and second magnetic cores. Moreover, the magnetizing step of the first and second magnetic cores may be performed simultaneously.

Then, the method 600 proceeds to step 622, which involves forming a first sense coil (e.g., 122) including first coil members coiling around the first magnetic core (e.g., 112 and/or 114) to define the first sense direction (e.g., 120), which is perpendicular to the first coil members. The method 600 may proceeds to step 624 after step 622. Alternatively, the method 600 may perform step 622 simultaneously with step 624. Like step 622, step 624 involves forming a second sense coil (e.g., 162) including second coil members coiling around the second magnetic core (e.g., 152 and/or 154). The second sense coil defines the second sense direction (e.g., 160), which is perpendicular to the second coil members.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:
1. An integrated circuit, comprising:
a semiconductor substrate;
a fluxgate device formed above the semiconductor substrate, the fluxgate device having:
a first magnetic core having a first magnetized direction deviating from a first sense direction by more than 0 degree and less than 90 degrees;

a first sense coil including first coil members coiling around the first magnetic core, the first sense coil defining the first sense direction perpendicular to the first coil members;
a second magnetic core arranged orthogonally to the first magnetic core, the second magnetic core having a second magnetized direction deviating from a second sense direction by more than 0 degree and less than 90 degrees; and
a second sense coil including second coil members coiling around the second magnetic core, the second sense coil defining the second sense direction perpendicular to the second coil members; and
a sense circuit having transistors formed partially in the semiconductor substrate and under the fluxgate device, the sense circuit coupled to the first sense coil and the second sense coil.

2. The integrated circuit of claim 1, wherein:
the first sense direction is orthogonally to the second sense direction.

3. The integrated circuit of claim 1, wherein:
the first magnetized direction deviates from the first sense direction by approximately 45 degrees clockwise; and
the second magnetized direction deviates from the second sense direction by approximately 45 degrees counterclockwise.

4. The integrated circuit of claim 1, wherein:
the first magnetic core has a first aspect ratio less than 30; and
the second magnetic core has a second aspect ratio less than 30.

5. The integrated circuit of claim 1, wherein:
the first magnetic core has a first width equal to or greater than 50 μm across the first sense direction; and
the second magnetic core has a second width equal to or greater than 50 μm across the second sense direction.

6. A fluxgate device, comprising:
a first magnetic core having a first magnetized direction deviating from a first sense direction by more than 0 degree and less than 90 degrees; and
a second magnetic core arranged orthogonally to the first magnetic core, the second magnetic core having a second magnetized direction deviating from a second sense direction by more than 0 degree and less than 90 degrees
wherein:
the first magnetic core has a first aspect ratio less than 30; and
the second magnetic core has a second aspect ratio less than 30.

7. The fluxgate device of claim 6, wherein the first sense direction is arranged orthogonally to the second sense direction.

8. The fluxgate device of claim 6, wherein the first magnetized direction is parallel to the second magnetized direction.

9. The fluxgate device of claim 6, wherein the first magnetized direction deviates from the first sense direction by approximately 45 degrees.

10. The fluxgate device of claim 6, wherein the second magnetized direction deviates from the second sense direction by approximately 45 degrees.

11. The fluxgate device of claim 6, wherein:
the first magnetic core has a first width equal to or greater than 50 μm across the first sense direction; and
the second magnetic core has a second width equal to or greater than 50 μm across the second sense direction.

12. The fluxgate device of claim 6, further comprising:
a first sense coil including first coil members coiling around the first magnetic core, the first sense coil defining the first sense direction perpendicular to a first plane of coiling; and
a second sense coil including second coil members coiling around the second magnetic core, the second sense coil defining the second sense direction perpendicular to a second plane of coiling.

13. A method, comprising:
forming a first magnetic core along a first sense direction of a fluxgate device;
forming a second magnetic core along a second sense direction of the fluxgate device orthogonal to the first sense direction; and
magnetizing the first and second magnetic cores according to a magnetization direction deviating from the first and second sense directions
wherein:
the forming the first magnetic core includes forming the first magnetic core having a first aspect ratio less than 30; and
the forming the second magnetic core includes forming the second magnetic core having a second aspect ratio less than 30.

14. The method of claim 13, wherein the magnetizing includes induced anisotropy magnetizing the first and second magnetic cores according to the magnetization direction.

15. The method of claim 13, wherein the magnetizing includes simultaneously magnetizing the first and second magnetic cores according to the magnetization direction.

16. The method of claim 13, wherein:
the magnetization direction deviates from the first sense direction by approximately 45 degrees clockwise; and
the magnetization direction deviates from the second sense direction by approximately 45 degrees counterclockwise.

17. The method of claim 13, wherein:
the forming the first magnetic core includes forming the first magnetic core having a first width greater than or equal to 50 μm across the first sense direction; and
the forming the second magnetic core includes forming the second magnetic core having a second width greater than or equal to 50 μm across the second sense direction.

18. The method of claim 13, further comprising:
forming a first sense coil including first coil members coiling around the first magnetic core and perpendicular to the first sense direction;
forming a second sense coil including second coil members coiling around the second magnetic core, the second sense coil defining the second sense direction perpendicular to the second coil members; and
forming a sense circuit having transistors defined partially in a semiconductor substrate; and
integrating the sense circuit and the fluxgate device to a single integrated circuit having the fluxgate device positioned above the sense circuit.

* * * * *